us008709911B2

United States Patent
Matsumine

(10) Patent No.: US 8,709,911 B2
(45) Date of Patent: Apr. 29, 2014

(54) METHOD FOR PRODUCING SOI SUBSTRATE AND SOI SUBSTRATE

(75) Inventor: Masao Matsumine, Chikuma (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 211 days.

(21) Appl. No.: 12/450,329

(22) PCT Filed: Apr. 15, 2008

(86) PCT No.: PCT/JP2008/000989
§ 371 (c)(1),
(2), (4) Date: Sep. 22, 2009

(87) PCT Pub. No.: WO2008/139684
PCT Pub. Date: Nov. 20, 2008

(65) Prior Publication Data
US 2010/0044829 A1    Feb. 25, 2010

(30) Foreign Application Priority Data

May 7, 2007 (JP) .................................. 2007-122573

(51) Int. Cl.
*H01L 21/324* (2006.01)
(52) U.S. Cl.
USPC .................................. 438/455; 257/E21.567
(58) Field of Classification Search
USPC ........... 257/347, E21.567, E27.112; 438/455, 438/459
See application file for complete search history.

(56) References Cited

U.S. PATENT DOCUMENTS

| 5,514,235 A | 5/1996 | Mitani et al. |
| 6,403,450 B1 | 6/2002 | Maleville et al. |
| 6,670,259 B1 * | 12/2003 | Chan ............................ 438/473 |

(Continued)

FOREIGN PATENT DOCUMENTS

| EP | 0 759 634 A1 | 2/1997 |
| EP | 1 688 991 A2 | 8/2006 |

(Continued)

OTHER PUBLICATIONS

Search Report issued in European Patent Application No. 08738595.1, on Jun. 1, 2010.

(Continued)

*Primary Examiner* — Wensing Kuo
(74) *Attorney, Agent, or Firm* — Oliff PLC

(57) ABSTRACT

The present invention is a method for producing an SOI substrate including the steps of: preparing a bond wafer and a base wafer which are composed of single crystal silicon wafers; forming an oxide film on a surface of at least one of the bond wafer and the base wafer so that a thickness of a buried oxide film after bonding becomes 3 μm or more; bonding the bond wafer and the base wafer via the oxide film; performing a low-temperature heat treatment at a temperature of 400° C. or more and 1000° C. or less to the bonded substrate; thinning the bond wafer to be an SOI layer; and increasing bonding strength by performing a high-temperature heat treatment at a temperature exceeding 1000° C. Thus, a method for producing an SOI substrate by which generation of slip dislocations is suppressed and an SOI substrate having a high-quality SOI layer can be obtained, for producing a SOI layer in which the thickness of a buried oxide film is thick as 3 μm or more by a bonding method, etc. are provided.

2 Claims, 4 Drawing Sheets

(56) References Cited

U.S. PATENT DOCUMENTS

| | | | |
|---|---|---|---|
| 2001/0046746 A1* | 11/2001 | Yokokawa et al. | 438/311 |
| 2005/0014346 A1* | 1/2005 | Mitani et al. | 438/459 |
| 2006/0125013 A1* | 6/2006 | Rim | 257/351 |

FOREIGN PATENT DOCUMENTS

| | | |
|---|---|---|
| FR | 2 777 115 | 10/1999 |
| JP | A 5-109678 | 4/1993 |
| JP | A 10-70054 | 3/1998 |
| JP | A 2001-230392 | 8/2001 |
| JP | A 2003-37253 | 2/2003 |
| JP | A-2005-347367 | 12/2005 |
| JP | A-2006-156858 | 6/2006 |
| JP | A 2007-73768 | 3/2007 |

OTHER PUBLICATIONS

Jul. 31, 2012 Notification of Reasons for Refusal issued in Japanese Patent Application No. 2007-122573 (with partial translation).

Office Action issued in European Application No. 08738595.1 dated May 29, 2012.

Jan. 8, 2013 Office Action issued in Japanese Patent Application No. 2007-122573 (with partial translation).

* cited by examiner

Figs. 5

| | COMPARATIVE EXAMPLE 3 | COMPARATIVE EXAMPLE 4 | COMPARATIVE EXAMPLE 5 |
|---|---|---|---|
| THICKNESS OF BURIED OXIDE FILM | 3.0 μm | 3.5 μm | 4.0 μm |
| HEAT TREATMENT TEMPERATURE | 1150°C | 1150°C | 1150°C |
| XRT IMAGE | | | |
| MAXIMUM LENGTH OF SLIP DISLOCATIONS | 21.8mm | 25.5mm | 132.7mm |

| | COMPARATIVE EXAMPLE 6 | COMPARATIVE EXAMPLE 7 | COMPARATIVE EXAMPLE 8 |
|---|---|---|---|
| THICKNESS OF BURIED OXIDE FILM | 4.5 μm | 5.0 μm | 6.0 μm |
| HEAT TREATMENT TEMPERATURE | 1150°C | 1200°C | 1200°C |
| XRT IMAGE | | | |
| MAXIMUM LENGTH OF SLIP DISLOCATIONS | 196.4mm | 200mm | 200mm |

METHOD FOR PRODUCING SOI SUBSTRATE AND SOI SUBSTRATE

TECHNICAL FIELD

The present invention relates to a method for producing an SOI (Silicon on Insulator) substrate by a bonding method and an SOI substrate, and particularly to a method for producing an SOI substrate and an SOI substrate in which two single crystal silicon wafers are bonded via a silicon dioxide film (hereinafter referred to as an oxide film).

BACKGROUND ART

As one of substrates for semiconductor devices, there is an SOI substrate having a silicon layer (hereinafter sometimes referred to as an SOI layer) formed on a silicon oxide film, which is an insulator. This SOI substrate has characteristics, such as small parasitic capacitance, high radioactivity resistance, and the like, since the SOI layer in a substrate surface portion to be used as a device fabrication area is electrically separated by a buried oxide film layer (a BOX layer) from the inside of the substrate. For that reason, the SOI substrate is expected to provide effects such as high-speed and low-power consumption operation, soft error prevention, and the like, and thus it is considered as a promising substrate for high performance semiconductor devices.

As one of methods for producing this SOI substrate, a method called a bonding method is known. The method for producing an SOI substrate by the bonding method consists of three steps which are a step of initial bonding, a step of heat treatment, and a step of reducing film thickness (see, e.g., Japanese Unexamined Patent Application Publication (Kokai) No. 2003-37253, etc). As the method for the reducing film thickness, there are a method for, e.g., grinding or polishing a bond wafer until a desired thickness, a method for delaminating the bond wafer at an ion-implanted layer based on a method called an ion implantation delamination method, and others.

This method for producing an SOI substrate by the bonding method will be explained more specifically.

A flow chart showing an example of a conventional method for producing an SOI substrate by the bonding method is shown in FIG. 4.

First, as shown in FIG. 4(a'), a bond wafer (a single crystal silicon wafer to be an SOI layer for forming semiconductor devices) 61 and a base wafer (a single crystal silicon wafer to be a supporting substrate) 62 are prepared (step a'). Next, as shown in FIG. 4(b'), a silicon oxide film 63 to be a buried oxide film is formed on a surface of at least one of the single crystal silicon wafers (FIG. 4 shows an example in which the oxide film is formed on the base wafer) (step b'). Next, as shown in FIG. 4(c'), the bond wafer 61 and the base wafer 62 are closely contacted via the oxide film 63 and are bonded. In this way, a substrate 70 in which two wafers are bonded and which has a buried oxide film 73 and a bonded plane 64 is obtained (step c').

Next, as shown in FIG. 4(d'), a heat treatment to increase bonding strength of the bonded two wafers is performed at a temperature of 1100° C. or more (step d'). After cooling, then, as shown in FIG. 4(e'), the bond wafer is thinned until a desired thickness by grinding, polishing, chemical treating, or the like, to be an SOI layer 71 (step e').

In this way, by the bonding method, an SOI substrate 80 is produced.

However, if an SOI substrate in which a thickness of a buried oxide film is thick as 3 μm or more is produced by the conventional method as the above, slip dislocations (which are also just called slips) are generated and it has been impossible to obtain an SOI substrate having a high-quality SOI layer.

DISCLOSURE OF INVENTION

The present invention has been made in view of the problems described above, and an object of the present invention is mainly to provide a method for producing an SOI substrate by which generation of slip dislocations is suppressed and an SOI substrate having a high-quality SOI layer can be obtained, for producing a SOI wafer in which a thickness of a buried oxide film is thick as 3 μm or more by a bonding method.

To achieve the object, the present invention provides a method for producing an SOI substrate in which an SOI layer is formed on a buried oxide film by a bonding method, including at least the steps of: preparing a bond wafer and a base wafer which are composed of single crystal silicon wafers; forming an oxide film on a surface of at least one of the bond wafer and the base wafer so that a thickness of a buried oxide film after bonding becomes 3 μm or more; bonding the bond wafer and the base wafer via the oxide film; performing a low-temperature heat treatment at a temperature of 400° C. or more and 1000° C. or less to the substrate made by bonding the bond wafer and the base wafer; thinning the bond wafer to be an SOI layer; and increasing bonding strength by performing a high-temperature heat treatment at a temperature exceeding 1000° C.

According to the method for producing an SOI substrate as the above, during the heat treatment at the stage before the thinning of the bond wafer, in which the bond wafer is thick, a strain based on a difference of thermal expansion coefficients between the single crystal silicon layer and the buried oxide film can be comparatively small, and the generation of slip dislocations can be suppressed, since the heat treatment temperature is low temperature of 400° C. or more and 1000° C. or less. In addition, according to the heat treatment as the above, the bonding strength necessary for the next step of thinning the bond wafer by grinding and the like can be obtained, and breakage like peeling off of the substrate made by bonding two wafers during the thinning of the bond wafer can be prevented.

Furthermore, during the heat treatment at the stage after the bond wafer is thinned (i.e., at the stage in which the single crystal silicon layer to be an SOI layer is thin), the bonding strength can be sufficiently increased, since the heat treatment temperature is a high temperature of 1000° C. or more. At this time, the bond wafer (the SOI layer) is already thinned, therefore a stress in the SOI layer by the strain based on the difference of the thermal expansion coefficients between the single crystal silicon layer and the buried oxide film becomes easy to be relaxed, and thus, slip dislocations can be suppressed even if at a high temperature as 1000° C. or more.

Accordingly, the generation of slip dislocations is suppressed and an SOI substrate having a high-quality SOI layer can be produced, even if the buried oxide film after bonding is thick as 3 μm or more. In addition, the bonding strength of this SOI substrate is sufficiently high.

In this case, it is preferable that the oxide film formed on a surface of at least one of the bond wafer and the base wafer is formed only on the base wafer.

According to the method for producing an SOI substrate in which the oxide film, which is described as formed on a surface of at least one of the bond wafer and the base wafer in the above, is formed only on the base wafer as the above, warpage of the SOI substrate to be finally produced can be reduced.

In addition, the thinning of the bond wafer may be performed by at least one or more techniques of grinding, polishing, and etching.

When the bond wafer is thinned by at least one or more techniques of grinding, polishing, and etching as the above, an SOI substrate having a comparatively thick SOI layer, for example, as 1 μm or more, can be effectively produced at low cost.

Furthermore, the present invention provides an SOI substrate produced by the method for producing an SOI substrate according to any one of the above.

When the SOI substrate is produced by the method for producing an SOI substrate according to any one of the above, the SOI substrate can be an SOI substrate having a thick buried oxide film as 3 μm or more, a high-quality SOI layer, in which the generation of slip dislocations can be suppressed, and sufficiently high bonding strength.

Moreover, the present invention provides an SOI substrate produced by a bonding method, in which a thickness of a buried oxide film thereof is 3 μm or more, a thickness of an SOI layer thereof is 1 μm or more, a bonding strength thereof is 600 kg/cm$^2$ or more, and there is no slip dislocation therein.

When the SOI substrate is produced by a bonding method, in which the thickness of a buried oxide film thereof is 3 μm or more, a thickness of an SOI layer thereof is 1 μm or more, a bonding strength thereof is 600 kg/cm$^2$ or more, and there is no slip dislocation therein as the above, the SOI substrate can be high quality without a slip dislocation in the SOI layer, and thus can be used to various purposes, even for the SOI substrate in which the thickness of the SOI layer is thick as 1 μm or more and the thickness of the buried oxide film is thick as 3 μm or more. In addition, there is no problem to subject the SOI substrate to a device fabrication process, because its bonding strength is sufficiently high.

In this case, the SOI layer may be thinned by at least one or more techniques of grinding, polishing, and etching.

When the SOI layer is thinned by at least one or more techniques of grinding, polishing, and etching as the above, the SOI substrate can be an SOI substrate having a thick-film SOI layer produced by lower cost.

When the method for producing an SOI substrate according to the present invention is adopted, the SOI substrate having an SOI layer of high quality by suppressing the generation of slip dislocations can be produced while securing a sufficient bonding strength, even if the oxide film is formed so that the buried oxide film after bonding becomes a thick-film as 3 μm or more.

In addition, when the SOI substrate according to the present invention is adopted, the SOI substrate can be without a slip dislocation in the SOI layer, with high quality, used to various purposes, as the SOI substrate in which the thickness of the SOI layer is 1 μm or more and the thickness of the buried oxide film is as 3 μm or more. In addition, there is no problem to subject the SOI substrate to a device fabrication process, because its bonding strength is sufficiently high.

BRIEF DESCRIPTION OF THE DRAWINGS

FIG. 5 are XRT images showing generation of slip dislocations of SOI substrates produced in accordance with a conventional method for producing an SOI wafer.

BEST MODE(S) FOR CARRYING OUT THE INVENTION

Figure 1:
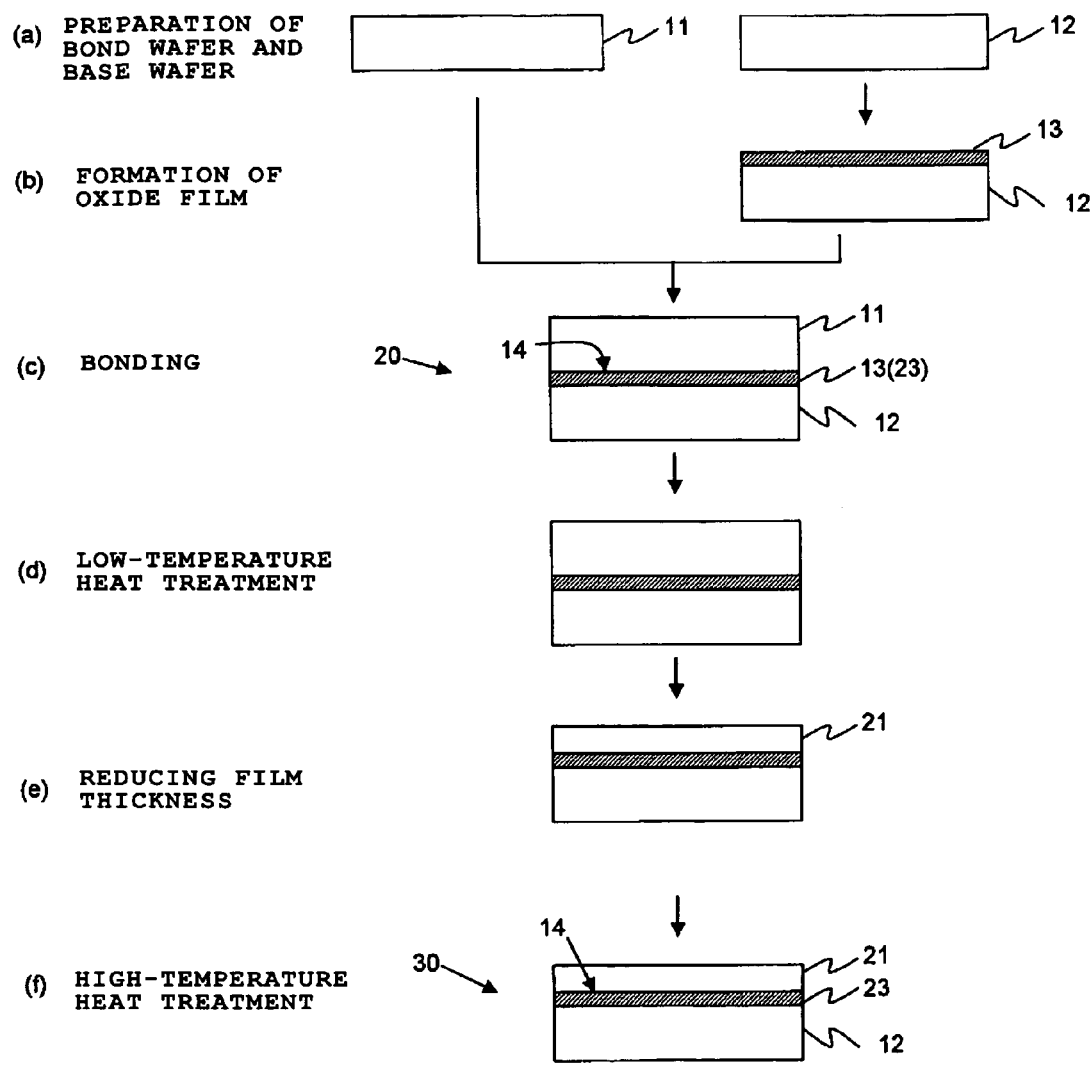
FIG. 1 is a flowchart showing an example of a method for producing an SOI substrate of the present invention.

Hereinafter, the present invention will be specifically described, however the present invention is not limited thereto.

As described above, there has been the problem that, if an SOI substrate in which the thickness of a buried oxide film is thick as 3 μm or more is produced by the conventional method for producing an SOI substrate by the bonding method, slip dislocations are generated and it is impossible to obtain an SOI substrate having a high-quality SOI layer.

In order to resolve such a problem, the present inventors have investigated as follows.

First, at the time immediately after bonding a bond wafer and a base wafer, the side of the bond wafer has not been thinned yet. Therefore, the present inventors considered that, if a bonding heat treatment at a high temperature as 1100° C. or more is directly performed as conventionally, especially when a buried oxide film is a thick film as 3 μm or more, a strain based on a difference of thermal expansion coefficients between the single crystal silicon layer and the buried oxide film should become large and the slip dislocations should be generated.

Based on this consideration, the present inventors have found out a method of: making a heat treatment after bonding of two wafers be at a low temperature to the extent not interfering with the step of reducing film thickness; making the two wafers in a state temporarily bonding (temporal bonding); after the reducing film thickness, performing a high-temperature heat treatment to further increase the bonding strength to make two wafers be in a state having a bonding strength required for an ordinal SOI substrate (permanent bonding). The present inventors have found out that, according to the method for producing an SOI substrate as the above, by making the heat treatment before the thinning of the bond wafer be at a low temperature, a strain based on the difference of the thermal expansion coefficients between the single crystal silicon layer and the thick buried oxide film can be comparatively small and generation of slip dislocations can be suppressed, and by the high-temperature heat treatment at the stage after the bond wafer has been thinned, since the bond wafer (the SOI layer) has been thinned, a stress of the SOI layer by the strain based on the difference of the thermal expansion coefficients between the single crystal silicon layer and the buried oxide film becomes easy to be relaxed, which suppress the generation of slip dislocations.

In addition, the present inventors have conducted further experiments and studies, optimized the temperature of low-temperature heat treatment and the temperature of high-temperature heat treatment which are mentioned above, and have conceived that, according to the method for producing an SOI substrate as the above, the generation of slip dislocations which have been generated as for an SOI substrate in which the thickness of the buried oxide film is 3 μm or more, and have completed the present invention.

The present invention will be explained in more details hereinafter with reference to the drawings, but the present invention is not limited thereto.

FIG. 1 is a flowchart showing an example of a method for producing an SOI substrate of the present invention.

First, as shown in FIG. 1(a), a bond wafer 11 and a base wafer 12 which are composed of single crystal silicon wafers are prepared (step a). The bond wafer is a single crystal silicon wafer to be an SOI layer for forming semiconductor devices, and the base wafer is a single crystal silicon wafer to be a supporting substrate. The kind of the single crystal silicon wafer is not limited in particular, and can be elected as needed.

Next, as shown in FIG. 1(b), an oxide film 13 is formed on a surface of at least one of the bond wafer 11 and the base wafer 12 so that a thickness of a buried oxide film after bonding becomes 3 μm or more (step b).

If this oxide film 13 is formed only on the base wafer 12 as shown in FIG. 1(b), that is preferable because warpage of an SOI substrate to be finally produced can be reduced. In addition, in the present invention, the oxide film 13 is formed so that the thickness of the buried oxide film after bonding become 3 μm or more. That is, if the oxide film is formed only on the bond wafer or only on the base wafer, the thickness of that oxide film is 3 μm or more; and if the oxide films are formed on both of the bond wafer and the base wafer, the total of the thicknesses of both the oxide films is 3 μm or more. In addition, for forming the oxide films on both of the bond wafer and the base wafer, if the oxide film to be formed on the base wafer is thickened than the oxide film to be formed on the bond wafer, that is preferable because warpage of an SOI substrate to be finally produced can be reduced.

Next, as shown in FIG. 1(c), the bond wafer 11 and the base wafer 12 are bonded via the oxide film 13 and made to be a substrate (bonded wafer) 20 made by bonding the two wafers (step c). For example, the bond wafer 11 and the base wafer 12 can be bonded by being closely contacted at the room temperature under a clean atmosphere. Along with this, the oxide film 13 becomes a buried oxide film 23. In addition, as mentioned above, if the oxide film 13 is formed only on the base wafer 12, a bonded plane 14 is between the buried oxide film 13 and the bond wafer 11.

Next, a low-temperature heat treatment at a temperature of 400° C. or more and 1000° C. or less is performed on the substrate 20 made by bonding the bond wafer 11 and the base wafer 12 (step d). This low-temperature heat treatment step can be performed under an oxidizing atmosphere, an inert atmosphere, and the like.

If the heat treatment temperature of this low-temperature heat treatment is 400° C. or more as mentioned above, the bonding strength necessary for the next thinning step of the bond wafer (step e) can be obtained. In addition, by setting the heat treatment temperature at 1000° C. or less, since a strain based on the difference of the thermal expansion coefficients between the single crystal silicon layer and the buried oxide film can be comparatively small, introduction of slip dislocations into a single crystal silicon layer to be an SOI layer during the low-temperature heat treatment can be suppressed.

In order to secure the bonding strength more certainly, it is preferable to set the heat treatment temperature at 700° C. or more, and for example, it is preferable to set it at 800° C. or more.

In order to prevent introduction of slip dislocations into the single crystal silicon layer to be an SOI layer more certainly, it is preferable to set the heat treatment temperature of this low-temperature heat treatment lower, and it is more certain to set it at 900° C. or less. An actual heat treatment temperature is preferably to be optimized according to a trade-off between the bonding strength and the effect of suppression of slip dislocations mentioned above.

After this low-temperature heat treatment, the bond wafer 11 is thinned. However, it is preferable to perform a peripheral processing to trim the shape of the peripheral portion of the bonded wafer 20, before the thinning of the bond wafer 11. By performing a peripheral processing of the bonded wafer 20 in this way, generation of particles from the peripheral portion can be prevented in the thinning step or later.

Next, as shown in FIG. 1(e), the bond wafer 11 is thinned to be an SOI layer 21 (step e).

Specific techniques for the thinning are not especially limited; however, it is preferable to perform it by at least one or more techniques of grinding, polishing, and etching. According to these techniques for thinning, the bond wafer can be effectively thinned at low cost. Especially, in the case of obtaining a comparatively thick SOI layer, for example, as 1 μm or more and furthermore as 5 μm or more, the thinning can be effectively performed at low cost.

In addition, the above techniques can be combined as needed. For example, it is possible to eliminate a strain along with the grinding, by an acid etching by hydrofluoric-nitric acid and the like, or by an alkaline etching by NaOH and the like, after thinning the bond wafer at high-speeds by grinding.

Note that, if the oxide film has been formed on the surface of the bond wafer 11, the oxide film is eliminated during this thinning process.

After the step of thinning the bond wafer 11 is performed, a cleaning and the like is subjected as needed, and subsequently, as shown in FIG. 1(f), a high-temperature heat treatment at a high temperature exceeding 1000° C. is performed (step f). By this high-temperature heat treatment, the bonding strength of the bonded plane 14 is increased. This high-temperature heat treatment can be also performed under an oxidizing atmosphere, an inert atmosphere, and the like.

By setting the heat treatment temperature of this high-temperature heat treatment to be exceeding 1000° C., the bonding strength can be sufficient, and especially can be a bonding strength necessary when subjected to a device fabrication process. The heat treatment temperature of this high-temperature heat treatment is preferably set at 1100° C. or more, for example, at 1150° C., in order to obtain a higher bonding strength. In addition, it is possible to perform the heat treatment at a higher temperature of 1200° C. or more.

In addition, if the high-temperature heat treatment is performed at a higher temperature as 1200° C. or more, there is a possibility to shorten the amount of time to be taken for the high-temperature heat treatment step, and to improve production efficiency.

If the above high-temperature heat treatment is performed under an oxidizing atmosphere, a surface oxide film is formed on the surface of the SOI layer 21. In this case, the surface oxide film is eliminated by cleaning the surface of the SOI layer 21 by hydrofluoric acid and the like.

After that, surface flatness of the SOI layer 21 is improved by polishing and the like, where necessary.

After such steps as mentioned above, an SOI substrate 30 as shown in FIG. 1(f), in which the buried oxide film 23 with the thickness of 3 μm or more is placed on the base wafer (a supporting substrate) 12, and having the SOI layer 21 on the buried oxide film 23, can be produced.

According to the present invention, an SOI substrate in which the thickness of the buried oxide film is 3 μm or more, the thickness of the SOI layer is 1 μm or more and there is no slip dislocation can be produced by a bonding method. In addition, as described in Japanese Unexamined Patent Application Publication (Kokai) No. 10-70054, the bonding strength of the bonded plane 14 is enable to be 600 kg/cm² or more by the above-mentioned high-temperature heat treatment at a temperature of 1100° C. to 1200° C.

Hereinafter, the present invention is described more specifically showing examples of the present invention. However, the present invention is not limited thereto.

EXAMPLE 1

According to the steps as shown in FIG. 1, SOI substrates were produced by a bonding method as mentioned below.

First, as a bond wafer 11 and a base wafer 12, there were prepared two mirror-polished P-type single crystal silicon wafers produced by a CZ method having a diameter of 200 mm (8 inches), and a surface orientation of {100} (step a). The thicknesses of the wafers were 725 μm, and the resistances of the wafers were 1.0 to 50.0 Ωcm.

Next, on the surface of the base wafer 12, a silicon oxide film 13 having the thickness of 3 μm was formed by thermal oxidation (step b).

Next, the bond wafer 11 and the base wafer 12 were closely contacted so that they sandwiched the oxide film 13 and were bonded (step c).

Next, a low-temperature heat treatment was subjected to a bonded wafer 20 under an oxidizing atmosphere, at a heat treatment temperature of 850° C. (step d).

After a peripheral processing of the bonded wafer 20, the bond wafer 11 was thinned by a surface grinding and an etching and was formed an SOI layer 21 having a film thickness of about 30 μm (step e).

After cleaning and subsequently, a high-temperature heat treatment is performed under an oxidizing atmosphere, at a heat treatment temperature of 1150° C. (step f).

Next, a thin surface oxide film generated on the SOI layer by the above-mentioned high-temperature heat treatment was eliminated by a hydrofluoric acid, a polishing was performed, and an SOI substrate 30 having an SOI layer of 15 μm was obtained.

Figure 3:
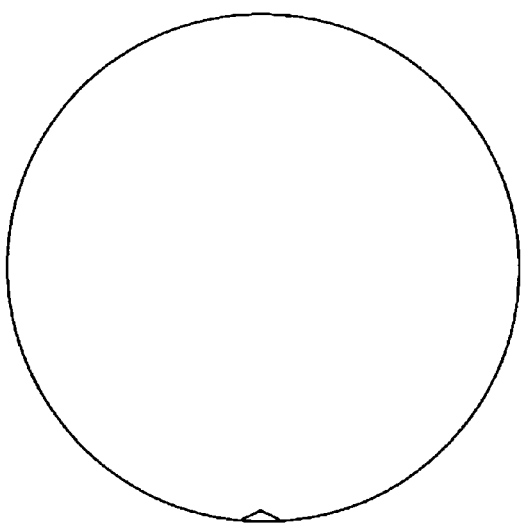
FIG. 3 is an XRT image showing generation of slip dislocations of the SOI substrate produced in accordance with the method for producing an SOI wafer of the present invention.

Generation status of slip dislocations in the SOI substrate 30 produced in that way was measured by using a XRT (an X-ray topograph). As showing the image measured by XRT in FIG. 3, no slip dislocation was generated.

EXAMPLES 2 to 8

In a manner similar to that of Example 1, however, setting film thickness of the oxide film 13 formed on the base wafer 12 (in Example 6, the oxide films 13 were formed on both of the bond wafer and the base wafer) and temperatures of bonding heat treatment as shown in the below-mentioned table 1, SOI substrates were produced. In addition, reducing film thickness and the final polishing were performed so that the film thickness of the respective SOI substrates 21 would finally become 20 μm.

TABLE 1

|  | Thickness of oxide film | Temperature of low-temperature heat treatment | Temperature of high-temperature heat treatment |
| --- | --- | --- | --- |
| Example 1 | 3 μm | 850° C. | 1150° C. |
| Example 2 | 5 μm | 850° C. | 1150° C. |
| Example 3 | 5 μm | 700° C. | 1150° C. |
| Example 4 | 6 μm | 850° C. | 1150° C. |

TABLE 1-continued

|  | Thickness of oxide film | Temperature of low-temperature heat treatment | Temperature of high-temperature heat treatment |
| --- | --- | --- | --- |
| Example 5 | 6 μm | 700° C. | 1150° C. |
| Example 6 | 7 μm (The base side 6 μm + The bond side 1 μm) | 850° C. | 1150° C. |
| Example 7 | 6 μm | 1000° C. | 1150° C. |
| Example 8 | 6 μm | 950° C. | 1150° C. |

Generation status of slip dislocations of the respective SOI substrates 30 produced in that way was measured by using the XRT (the X-ray topograph) in a manner similar to that of Example 1. As the result, no slip dislocation was generated, and the images measured by XRT were similar to Example 1 in FIG. 3.

In addition, the SOI substrates produced in Examples 1 to 8 were subjected to a device fabrication process. However, no delamination and the like was occurred, the respective bonding strengths were 600 kg/cm² or more, and there was no problem.

COMPARATIVE EXAMPLE 1

Figure 4:
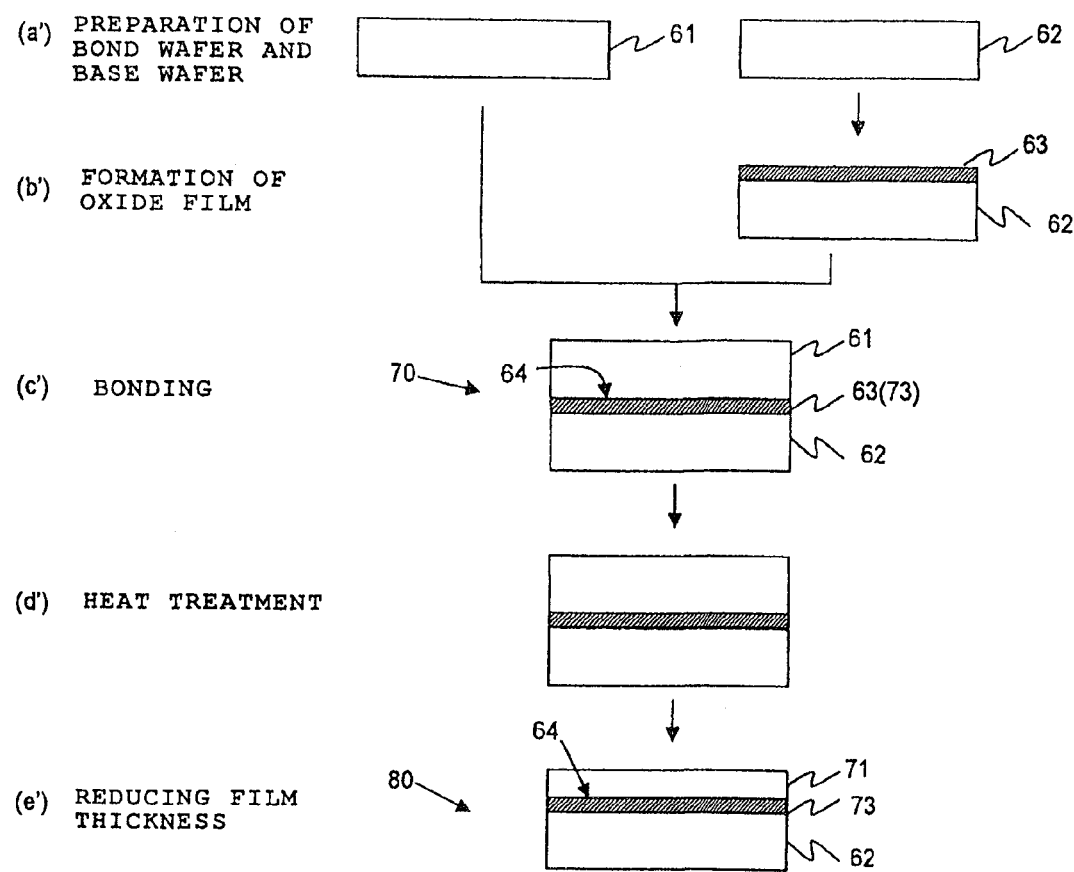
FIG. 4 is a flowchart showing an example of a conventional method for producing an SOI substrate.

According to the conventional method for producing an SOI substrate shown in FIG. 4, SOI substrates were actually produced as mentioned below.

First, two single crystal silicon wafers similar to the ones in Example 1 were prepared (step a').

On a surface of a base wafer 62, a silicon oxide film 63 having a film thickness of about 1 μm was formed by a thermal oxidation (step b').

Next, in a manner similar to that of step c in Example 1, a bond wafer 61 and the base wafer 62 were closely contacted so that they sandwiched the oxide film 63 and were bonded (step c').

Next, a bonding heat treatment was performed at 1150° C. under an oxidizing atmosphere (step d').

Next, after a peripheral processing of the bonded wafer 70, the SOI layer side of the bonded wafer 70 was thinned so that the thickness thereof became 15 μm by a surface grinding, etching, and polishing, and an SOI substrate 80 was obtained (step e').

Generation status of slip dislocations in the SOI substrate 80 produced in that way was measured by using the XRT in a manner similar to that of Example 1, and no slip dislocation was generated.

COMPARATIVE EXAMPLES 2 to 10

In a manner similar to that of Comparative Example 1, however, setting film thickness of the oxide film 63 formed on the base wafer 62 (in Comparative Example 10, the oxide films 63 were formed on both of the bond wafer and the base wafer) and temperatures of bonding heat treatment as shown in the below-mentioned table 2, SOI substrates were produced.

Note that Comparative Example 1 is also described in Table 2.

TABLE 2

| | Thickness of oxide film | Temperature of bonding heat treatment |
|---|---|---|
| Comparative example 1 | 1 μm | 1150° C. |
| Comparative example 2 | 2 μm | 1150° C. |
| Comparative example 3 | 3 μm | 1150° C. |
| Comparative example 4 | 3.5 μm | 1150° C. |
| Comparative example 5 | 4 μm | 1150° C. |
| Comparative example 6 | 4.5 μm | 1150° C. |
| Comparative example 7 | 5 μm | 1150° C. |
| Comparative example 8 | 5 μm | 1200° C. |
| Comparative example 9 | 6 μm | 1200° C. |
| Comparative example 10 | 7 μm (The base side 6 μm + The bond side 1 μm) | 1200° C. |

Generation status of slip dislocations in the SOI substrates produced in that way were measured by using the XRT in a manner similar to that of Comparative Example 1.

In addition to Comparative Example 1, no slip dislocation was generated in Comparative Example 2. This is considered because the thickness of the buried oxide film is 2 μm or less and a strain based on the difference of the thermal expansion coefficients between a single crystal silicon layer and a buried oxide film during the bonding heat treatment is comparatively small.

In Comparative Examples 3 to 10, slip dislocations were generated. The images measured by XRT and maximum lengths of slip dislocations (the lengths of the longest slip dislocation in each of a plane of a wafer) in Comparative Examples 3-10 are shown in FIG. 5.

Figure 2:
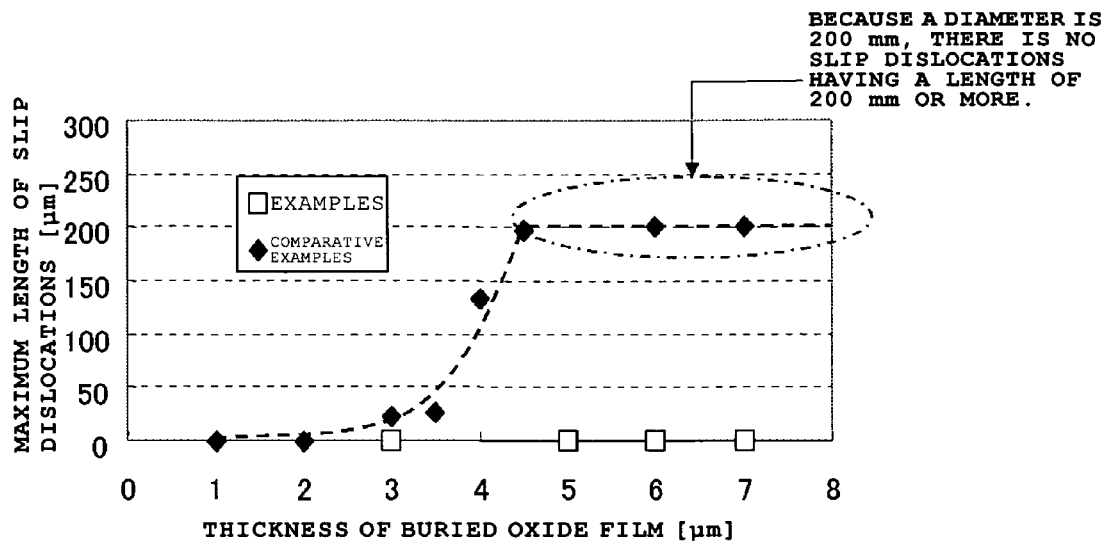
FIG. 2 is a graph showing the relationships between maximum lengths of slip dislocations and thicknesses of buried oxide films, regarding the SOI substrates produced according to the method for producing an SOI substrate of the present invention (Examples) and the SOI substrates produced according to a conventional method for producing an SOI substrate (Comparative Examples)

Based on the measurement results of Examples 1 to 8 and Comparative Examples 1 to 10 mentioned above, the relationships between maximum lengths of slip dislocations and thicknesses of buried oxide films are shown in FIG. 2.

According to this graph, it is revealed that according to the method for producing an SOI substrate of the present invention, an SOI substrate having a high-quality SOI layer in which the generation of slip dislocations was suppressed could be produced even if the thickness of a buried oxide film was 3 μm or more, unlike the inability according to the method for producing an SOI substrate by a conventional bonding method.

It is to be noted that the present invention is not limited to the embodiment described above. The above-described embodiment is just an exemplification, and any examples which have features substantially equal to a technical concept describe in claims of the present invention and demonstrate the same functions and effects are included in a technical scope of the present invention.

The invention claimed is:

1. A method for producing an SOI substrate in which an SOI layer having a thickness of 1 μm or more is formed on a buried oxide film by a bonding method, comprising at least the steps of:
   preparing a bond wafer and a base wafer which are composed of single crystal silicon wafers;
   forming an oxide film on a surface of at least one of the bond wafer and the base wafer so that a thickness of a buried oxide film after bonding becomes 3 μm or more;
   bonding the bond wafer and the base wafer via the oxide film; and
   performing the following steps in the following sequential order:
   (1) performing a low-temperature heat treatment at a temperature of 400° C. or more and 1000° C. or less to the substrate made by bonding the bond wafer and the base wafer;
   (2) thinning the bond wafer to be an SOI layer, the thinning of the bond wafer being performed only by grinding, or only by polish, or only by grinding and polishing; and
   (3) increasing bonding strength by performing a high-temperature heat treatment at a temperature exceeding 1000° C.

2. The method for producing an SOI substrate according to claim 1, wherein the oxide film formed on a surface of at least one of the bond wafer and the base wafer is formed only on the base wafer.

* * * * *